(12) United States Patent
Lai et al.

(10) Patent No.: US 8,063,807 B1
(45) Date of Patent: Nov. 22, 2011

(54) EQUALIZATION CIRCUITRY INCLUDING A DIGITAL-TO-ANALOG CONVERTER HAVING A VOLTAGE DIVIDER AND A MULTIPLEXER

(75) Inventors: Tin H. Lai, San Jose, CA (US); Sergey Shumarayev, Los Altos Hills, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 83 days.

(21) Appl. No.: 12/433,310

(22) Filed: Apr. 30, 2009

(51) Int. Cl.
*H03M 1/06* (2006.01)

(52) U.S. Cl. ......... 341/144; 341/118; 341/120; 341/154

(58) Field of Classification Search .......... 341/144–154, 341/118, 121
See application file for complete search history.

(56) References Cited

U.S. PATENT DOCUMENTS

| | | | |
|---|---|---|---|
| 5,394,437 A * | 2/1995 | Ayanoglu et al. ............. | 375/222 |
| 5,808,576 A * | 9/1998 | Chloupek et al. ............. | 341/144 |
| 5,844,941 A * | 12/1998 | Mack et al. .................... | 375/232 |
| 6,049,300 A * | 4/2000 | Shoval ........................... | 341/144 |
| 6,148,025 A * | 11/2000 | Shirani et al. ................. | 375/238 |
| 6,229,950 B1 * | 5/2001 | Kobayashi et al. ........... | 386/268 |
| 6,445,325 B1 * | 9/2002 | Burns ............................ | 341/144 |
| 6,486,818 B1 * | 11/2002 | Nicholson et al. ............ | 341/154 |
| 6,976,042 B2 * | 12/2005 | Ao et al. ........................... | 708/3 |
| 7,126,519 B1 * | 10/2006 | Xu ................................. | 341/144 |
| 7,171,438 B2 * | 1/2007 | Moudgill et al. .............. | 708/552 |
| 7,254,173 B1 * | 8/2007 | Fu et al. ......................... | 375/233 |
| 7,301,997 B1 * | 11/2007 | Wang et al. .................... | 375/232 |
| 7,304,596 B2 * | 12/2007 | Lin et al. ........................ | 341/145 |
| 7,336,211 B1 | 2/2008 | Lai et al. | |
| 2005/0116852 A1 * | 6/2005 | Otake ............................ | 341/154 |
| 2006/0188043 A1 * | 8/2006 | Zerbe et al. .................... | 375/346 |
| 2007/0121716 A1 * | 5/2007 | Nagarajan et al. ............ | 375/229 |
| 2008/0069276 A1 | 3/2008 | Wong et al. | |

* cited by examiner

*Primary Examiner* — Linh Nguyen
(74) *Attorney, Agent, or Firm* — Mauriel Kapouytian & Treffert LLP; Avarat Kapouytian

(57) ABSTRACT

An equalization circuitry that includes a digital-to-analog converter having a voltage divider and a multiplexer coupled to the voltage divider is described. In one implementation, the digital-to-analog converter provides a control signal to a plurality of single-stage equalizer control logic circuits. Also, in one implementation, the multiplexer receives a plurality of inputs from the voltage divider and selects an output from the plurality of inputs. Furthermore, in one implementation, the voltage divider includes a plurality of resistors coupled in series. Also, in one implementation, the voltage divider further includes a first resistor coupled to the plurality of resistors, ground, and a lowest voltage input terminal of the multiplexer, where a voltage across the first resistor is an input voltage to the lowest voltage input terminal. Additionally, in one implementation, the voltage divider further includes a second resistor coupled to the plurality of resistors and a supply voltage, where the supply voltage minus a voltage across the second resistor and a voltage across a resistor of the plurality of resistors is an input voltage to a highest voltage input terminal of the multiplexer. In one implementation, the first and second resistors are programmable in user mode.

24 Claims, 8 Drawing Sheets

EQUALIZATION CIRCUITRY INCLUDING A DIGITAL-TO-ANALOG CONVERTER HAVING A VOLTAGE DIVIDER AND A MULTIPLEXER

BACKGROUND

Embodiments of the present invention relate to equalization circuitry.

In some equalization circuitry, a digital-to-analog converter is used to control the amount of equalization. One type of digital-to-analog converter used in this context is an R-2R digital-to-analog converter. There are a number of disadvantages to using an R-2R digital-to-analog converter to control the amount of equalization in an equalization circuitry.

The R-2R digital-to-analog converter in such an equalization circuitry functions across two voltage domains, an upper voltage domain and a lower voltage domain, where the upper voltage domain has a voltage that is twice as large as that of the lower voltage domain. The output of the R-2R digital-to-analog converter feeding into the equalizer control knob circuits is in the lower voltage domain, whereas the digital binary high voltage input to the R-2R digital-to-analog converter and the supply voltage to the operational amplifier of the R-2R digital-to-analog converter are in the upper voltage domain. The control circuitry that feeds into the R-2R digital-to-analog converter and may use the same voltage supply as the equalizer (in this case, the lower voltage domain) communicates with the R-2R digital-to-analog converter across the two voltage domains. As a result, a voltage level shifter is used to convert voltages from one voltage domain to the other. The use of the voltage level shifter increases the overall device layout area. Similarly, the operational amplifier of the R-2R digital-to-analog converter also increases the overall device layout area.

Furthermore, the operational amplifier with its high power supply voltage consumes a large amount of power. Thus, the use of an R-2R digital-to-analog converter in an equalization circuitry results in both a larger device layout area and higher power consumption.

The higher power consumption and larger device layout area are further compounded by the fact that each single-stage equalizer control knob circuit has a separate R-2R digital-to-analog converter associated therewith. As used herein, a single-stage equalizer control knob circuit refers to an equalizer control knob circuit that directly controls the equalization of only a single stage of a multi-stage equalizer. This is in contrast to a multi-stage equalizer control knob circuit which directly controls the equalization of multiple stages of a multi-stage equalizer. In some cases, there are four single-stage equalizer control knob circuits, a separate one for each of the four stages of the equalizer. In such a case, there are four separate R-2R digital-to-analog converters, one for each of the four single-stage equalizer control knob circuits.

Moreover, in the R-2R digital-to-analog converter, the resistor ratio that determines the analog output voltage varies with temperature, process, and uncertainties in resistor ratios/values (e.g., poly resistor ratios/values). The variation in the resistor ratio distorts the analog output voltage and causes it to differ from its target value. This destroys the linearity between the output analog voltage and the digital binary value input to the R-2R digital-to-analog converter. As a result, in the R-2R digital-to-analog converter, there is a tradeoff between linearity and tuneability of the output analog voltage versus the digital binary input value.

Embodiments of the equalization circuitry of the present invention arise in this context.

SUMMARY

In one aspect, an embodiment of the present invention provides an equalization circuitry including a digital-to-analog converter having a voltage divider and a multiplexer coupled to the voltage divider. In one embodiment, the digital-to-analog converter provides a control signal to a plurality of single-stage equalizer control logic circuits. Also, in one embodiment, the multiplexer receives a plurality of inputs from the voltage divider and selects an output from the plurality of inputs.

In one embodiment, the voltage divider includes a plurality of resistors coupled in series. Also, in one embodiment, the voltage divider further includes a first resistor coupled to the plurality of resistors, ground, and a lowest voltage input terminal of the multiplexer, where a voltage across the first resistor is an input voltage to the lowest voltage input terminal. Additionally, in one embodiment, the voltage divider further includes a second resistor coupled to the plurality of resistors and a supply voltage, where the supply voltage minus a voltage across the second resistor and a voltage across a resistor of the plurality of resistors is an input voltage to a highest voltage input terminal of the multiplexer. In one embodiment, the first and second resistors are programmable in user mode.

An embodiment of the present invention uses less power and requires a smaller layout area. Additionally, an embodiment provides better tuning resolution and enhances adaptation stability, which provides better jitter performance.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use embodiments of the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
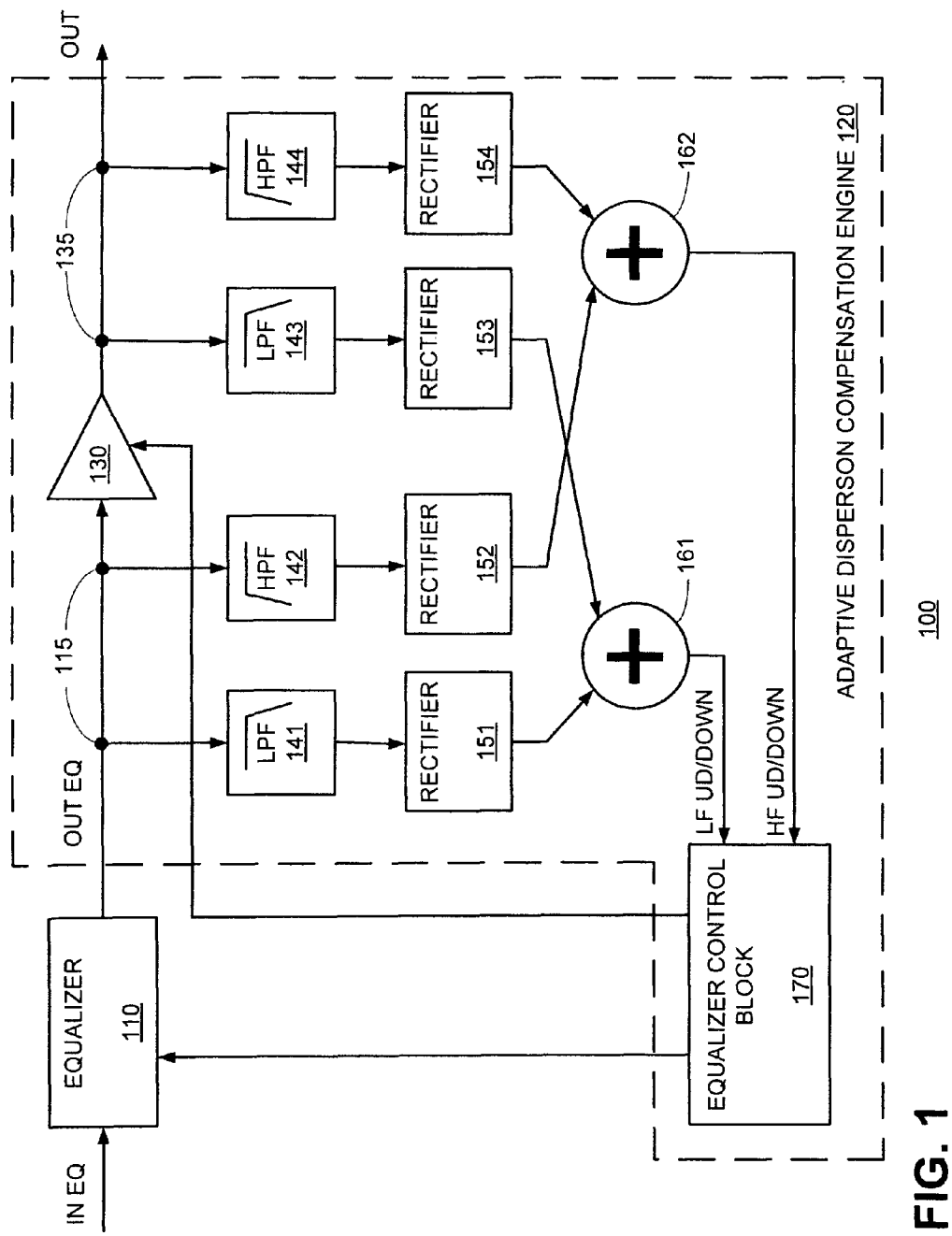
FIG. 1 is a simplified schematic block diagram of one embodiment of an equalization circuitry of the present invention.

FIG. 1 is a block diagram of one embodiment of an equalization circuitry of the present invention. In FIG. 1, equalization circuitry 100 includes equalizer (EQ) 110 (which may also herein be referred to as equalizer filter 110) and adaptive dispersion compensation engine (ADCE) 120 coupled to the equalizer 110. Equalization circuitry 100 may also herein be referred to as an adaptive equalization circuitry 100. Similarly, equalizer 110 may herein be referred to as an adaptive equalizer 110 or an adaptive equalizer filter 110. Also, in FIG. 1, ADCE 120 is shown as not including equalizer filter 110. Alternatively, ADCE 120 may be defined to include equalizer filter 110. In such a case, equalization circuitry 100 and ADCE 120 would be used interchangeably as they would refer to the same thing.

ADCE 120 includes reference edge generator (REG) 130, low pass filter (LPF) 141, high pass filter (HPF) 142, LPF 143, HPF 144, rectifiers 151-154, comparators 161 and 162, and equalizer control block 170, which are coupled as shown in FIG. 1. REG 130 outputs a reference edge, which the output of the equalizer 110 tries to mimic. LPFs 141 and 143 and HPFs 142 and 144, along with rectifiers 151-154 are used to extract the energy of the signals at nodes 115 and 135. It is to be noted that the signals at nodes 115 and 135 represent the signals output by equalizer 110 and REG 130, respectively. LPF 141 and rectifier 151 extract the low frequency (LF) energy of the signal at node 115. Similarly, LPF 143 and rectifier 153 extract the LF energy of the signal at node 135. The outputs of rectifiers 151 and 153 are provided to comparator 161, which compares the two outputs. Depending on the result of this comparison, comparator 161 provides an up or down signal to an LF counter (not shown in FIG. 1) of equalization control block 170. HPF 142 and rectifier 152 extract the high frequency (HF) energy of the signal at node 115. Similarly, HPF 144 and rectifier 154 extract the HF energy of the signal at node 135. The outputs of rectifiers 152 and 154 are provided to comparator 162, which compares the two outputs. Depending on the result of this comparison, comparator 162 provides an up or down signal to an HF counter (not shown in FIG. 1) of equalization control block 170. Equalization control block 170 provides control signals to control equalizer 110 and REG 130. As will be described in greater detail below in reference to FIG. 2, the control signals to equalizer 110 include multiple signals for controlling equalizer 110.

In one embodiment, equalization circuitry 100 starts with a maximum level of equalization which is then reduced or adjusted as necessary to obtain an optimal level of equalization. Starting with maximum level of equalization ensures that there would be enough energy detected by ADCE 120 even at the beginning of the equalization process.

Figure 2:
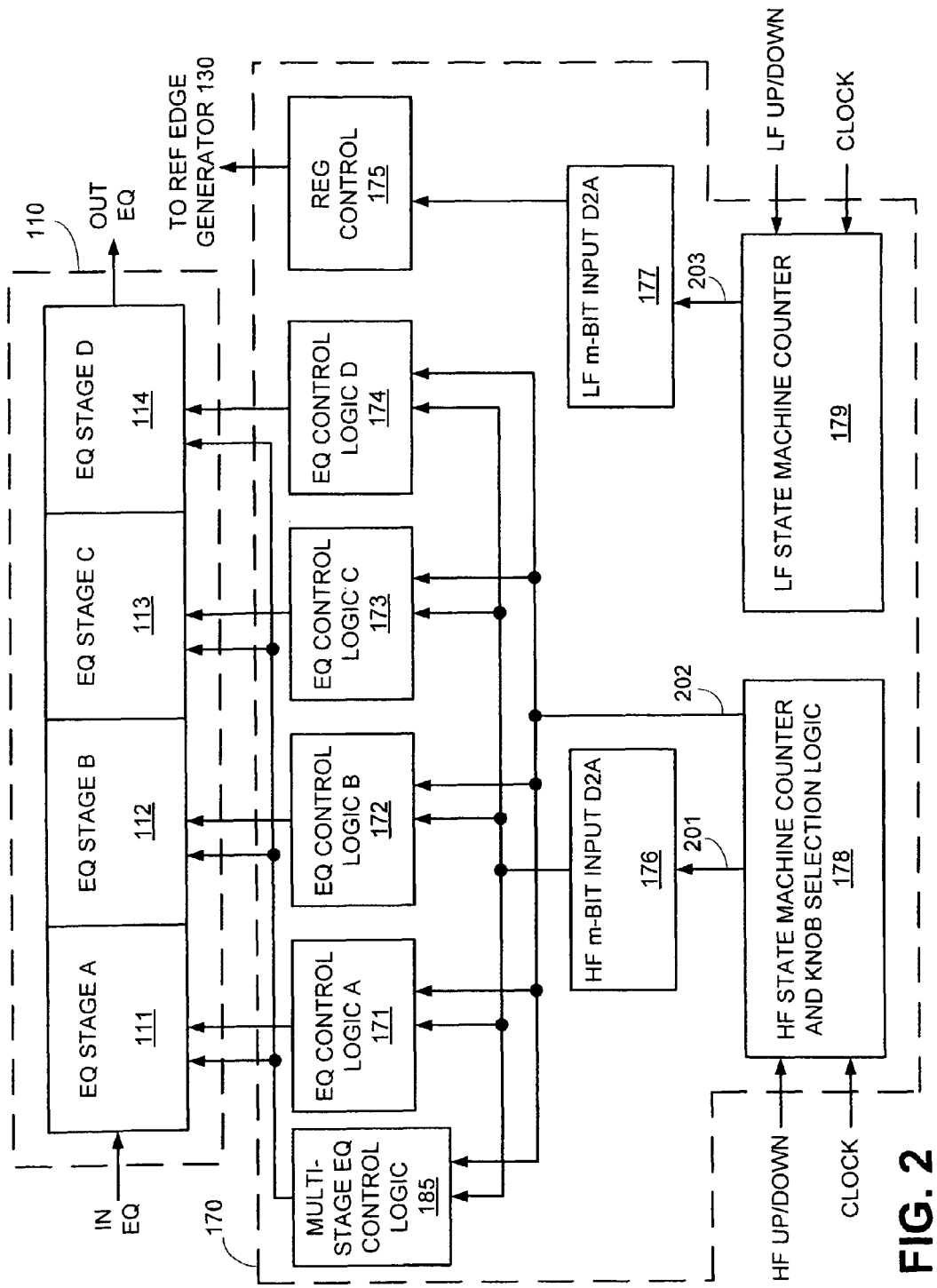
FIG. 2 is a more detailed diagram of the equalizer control block and the equalizer of FIG. 1.

FIG. 2 is a more detailed diagram of the equalizer control block and the equalizer of FIG. 1. In FIG. 2, equalizer 110 includes four equalizer stages. More specifically, it includes equalizer stages A, B, C, and D, which have also been referenced as equalizer stages 111, 112, 113, and 114, respectively. As equalizer 110 has multiple equalize stages, it is a multi-stage equalizer. Also, in FIG. 2, equalization control block 170 includes equalizer control logics A, B, C, and D (which have also been referenced as equalizer control logics 171, 172, 173, and 174, respectively, and are coupled to equalizer stages 111, 112, 113, and 114, respectively), REG control circuit 175, multi-stage equalizer control logic 185, HF m-bit D2A (digital-to-analog) converter 176, LF m-bit D2A converter 177, HF state machine counter and knob selection logic (SMCKSL) 178, and LF state machine counter (SMC) 179. Equalizer control logics 171 to 174 may also herein be referred to as equalizer control logic circuits 171 to 174 or equalizer control knob circuits 171 to 174. Similarly, multi-stage equalizer control logic 185 may also herein be referred to as multi-stage equalizer control logic circuit 185 or multi-stage equalizer control knob circuit 185. It is to be noted that equalizer control logic circuits 171 to 174 are single-stage equalizer control logic circuits. As such, equalizer control logic circuits 171 to 174 may also herein be referred to as single-stage equalizer control logic circuits 171 to 174. On the other hand, multi-stage equalizer control logic circuit 185 is a multi-stage equalizer control logic circuit.

HF SMCKSL 178 receives an HF UP/DOWN signal from comparator 162 (shown in FIG. 1) and a clock signal which is used for clocking HF SMCKSL 178. The state machine counter portion of HF SMCKSL 178 is a counter whose value is incremented or decremented depending on the value of the HF UP/DOWN signal. In one embodiment, the state machine counter is an m-bit counter, where m is an integer representing the number of selection bits in HF m-bit D2A converter 176. In one embodiment, m is equal to 6. The knob selection logic portion of HF SMCKSL 178 is a counter which has enough bits to select an equalizer control logic from single-stage equalizer control logics 171 to 174 and multi-stage equalizer control logic 185. In one embodiment, as there are five equalizer control logics to select from, the knob selection logic is a 3 bit counter. Thus, in embodiment, HF SMCKSL 178 is a counter with enough bits for providing a selection signal to HF m-bit D2A converter 176 and equalizer control logics 171-174 and 185. In one embodiment, HF SMCKSL 178 is a 9 bit counter with the 6 least significant bits used as a selection signal (selection signal 201) provided to HF m-bit D2A converter 176 and the 3 most significant bits used as a selection signal (selection signal 202) provided to equalizer control logics 171-174 and 185.

HF m-bit D2A converter 176 receives selection signal 201 from HF SMCKSL 178 and uses the signal to select or provide a control voltage signal. This control voltage signal, which in one embodiment, ranges from 0 (i.e., ground voltage) to Vcc (i.e., the supply voltage) is provided to all single-stage equalizer control logics 171 to 174 and to multi-stage equalizer control circuit 185. Equalizer control logics 171-174 and 185 also receive selection signal 202. In one embodiment, HF m-bit D2A converter 176 may be any of those shown in FIG. 3, 4, or 6.

At any given time during equalization, each equalizer control logic from equalizer control logics 171-174 and 185 is in one of the following three states: (1) before current, (2) current, and (3) after current. A before current equalizer control logic is one that was current prior to the current equalizer control logic, whereas an after current equalizer control logic is one that will be current after the current equalizer control logic. When an equalizer control logic is in the current state, then it will provide its corresponding equalizer stage (or stages in the case of equalizer control logic 185) with the voltage output by HF m-bit D2A converter 176. When an equalizer control logic is in the before current state, then it will provide its corresponding equalizer stage (or stages in the case of equalizer control logic 185) with a minimum control voltage (e.g., ground voltage). When an equalizer control logic is in the after current state, then it will provide its corresponding equalizer stage (or stages in the case of equalizer control logic 185) with a maximum control voltage (e.g., Vcc). Using selection signal 202, each equalizer control logic circuit determines its state and provides its corresponding equalizer stage (or stages in the case of equalizer control logic 185) with the appropriate control voltage. It is to be noted that, for single-stage equalizer control logics 171 to 174, the corresponding equalizer stages are equalizer stages 111 to 114, respectively. In other words, each of single-stage equalizer control logics 171 to 174 has one corresponding equalizer stage. On the other hand, for multi-stage equalizer control logic 185, the corresponding equalizer stages are equalizer stages 111 to 114.

In one embodiment, each equalizer control logic includes combinational logic (not shown), a multiplexer (not shown), and an identifier. In such an embodiment, selection signal 202 in conjunction with the equalizer control identifier is used by the combinational logic to determine which of the above three states corresponds to the equalizer control logic. The output of the combinational logic is used as a select signal in the multiplexer for selecting one of its three inputs, i.e., one of the minimum control voltage (e.g., ground voltage), the output of HF m-bit D2A converter 176, and the maximum control voltage (e.g., Vcc). In one embodiment, in addition to the selected output of HF m-bit D2A converter 176 (which is also herein referred to as the output of HF m-bit D2A converter 176), each equalizer control logic also receives the minimum control voltage and the maximum control voltage. In one embodiment, HF m-bit D2A converter 176 provides seven voltage signals from which the minimum and maximum control voltages are selected based on the backplane characteristics. In one embodiment, the seven voltage signals are provided from the voltage divider (not shown in FIG. 2) of HF m-bit D2A converter 176.

In equalization control block 170, one digital-to-analog converter (namely HF m-bit D2A converter 176) is used to control all four single-stage equalizer control logic circuits 171 to 174 and their corresponding equalizer stages 111 to 114. This reduces the layout area and the power consumption of equalization circuitry 100. In another embodiment, each single-stage equalizer control logic circuit and its corresponding equalizer stage may have a separate digital-to-analog converter associated therewith. Such an embodiment would still have a reduced layout area and power consumption relative to an equalization circuitry using an R-2R digital-to-analog converter, because use of embodiments of the digital-to-analog converter of the present invention does not require a level shifter, an operational amplifier, or a higher voltage power supply.

In one embodiment, single-stage equalization control logic circuits 171 to 174 control the peak gain response of their individual corresponding equalizer stages and, therefore, control the peak gain response of the overall equalizer 110. In one embodiment, the peak gain response occurs near the high frequency side of the HF range. On the other hand, in one embodiment, multi-stage equalization control circuit 185 controls the low to medium range gain response of the overall equalizer 110. In one embodiment, the low to medium range gain response occurs near the low to medium frequency side of the HF range. As can be seen in FIG. 2, the control signal from multi-stage equalization control circuit 185 is applied to all stages of equalizer 110.

LF SMC 179 receives an LF UP/DOWN signal from comparator 161 (shown in FIG. 1) and a clock signal which is used for clocking LF SMC 179. LF SMC 179 is a counter whose value is incremented or decremented depending on the value of the LF UP/DOWN signal. In one embodiment, LF SMC 179 is an m-bit counter, where m is an integer representing the number of selection bits in LF m-bit D2A converter 177. In one embodiment, m is equal to 6. In one embodiment, the value in LF SMC 179 is used as a selection signal (selection signal 203) provided to LF m-bit D2A converter 177.

LF m-bit D2A converter 177 receives selection signal 203 from LF SMC 179 and uses the signal to select a control voltage signal. This control voltage signal, which in one embodiment, ranges from 0 (i.e., ground voltage) to Vcc (i.e., the supply voltage) is provided to REG control circuit 175. In turn, REG control circuit 175 provides a control signal to reference edge generator 130 (shown in FIG. 1). In one embodiment, LF m-bit D2A converter 177 may be such as any of those shown in FIG. 3, 4, or 6. In another embodiment, LF m-bit D2A converter 177 may be another type of digital-to-analog converter.

Figure 3:
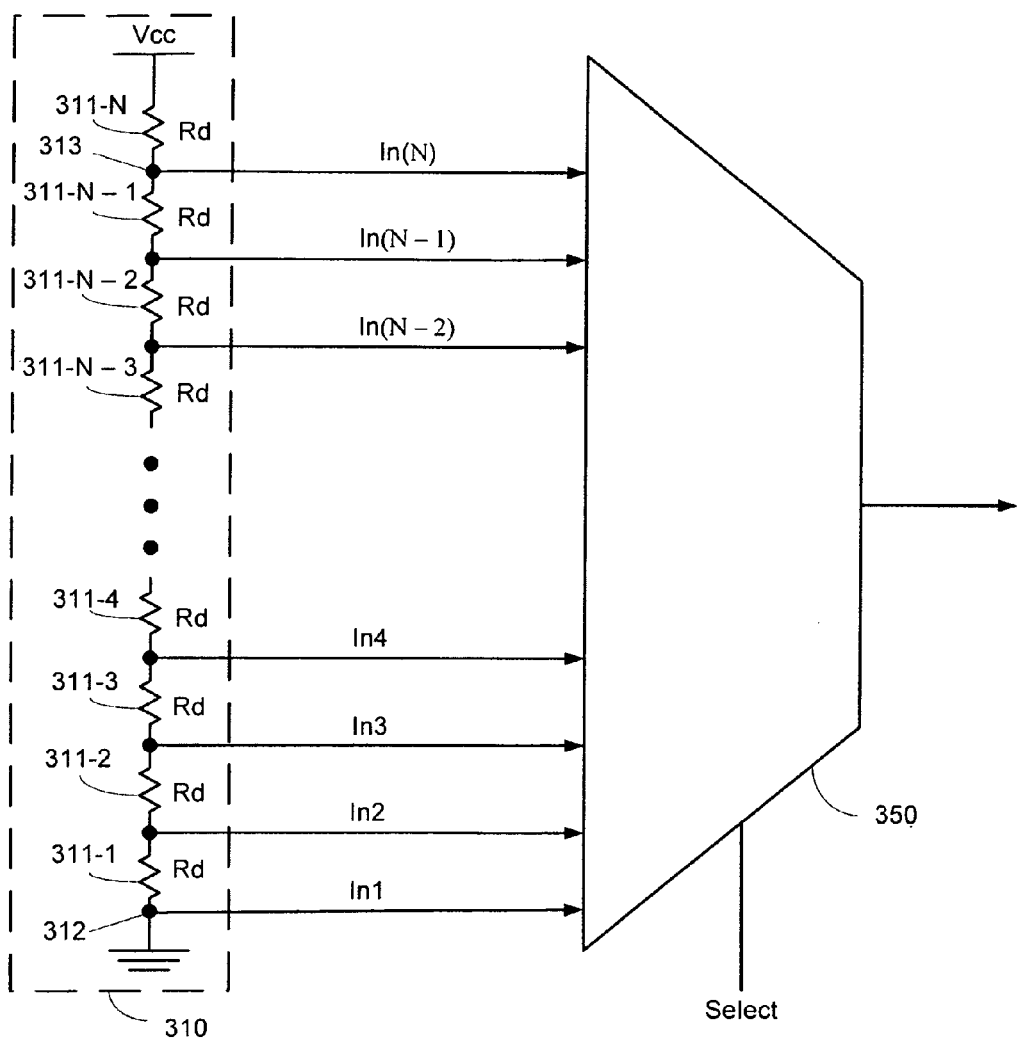
FIG. 3 is a detailed diagram of one embodiment of the digital-to-analog converter of FIG. 2.

FIG. 3 is a detailed diagram of one embodiment of the digital-to-analog converter of the present invention. In FIG. 3, digital-to-analog converter 300 includes voltage divider 310 and multiplexer 350 coupled as shown. Voltage divider 310 includes resistors 311-1 to 311-N, each of which has a resistance Rd. Multiplexer 350 is an N by 1 multiplexer, where N is an integer representing the number of inputs to multiplexer 350. In one embodiment N is equal to $2^m$, where m is as defined. In FIG. 3, multiplexer 350 has inputs In1 to InN. The first input, input In1, is the lowest voltage input into multiplexer 350 and is coupled to node 312, which is coupled to ground. The last input, input InN, is the highest voltage input into multiplexer 350 and is coupled node 313. The voltage at node 313 is Vcc-$I_{310}$*Rd, where Vcc is the supply voltage applied to voltage divider 310 and $I_{310}$ represents the current through voltage divider 310. In one embodiment, $I_{310}$ is a low current. In other words, in one embodiment, voltage divider 310 is a low Icc voltage divider.

In addition to inputs In1 to InN from voltage divider 310, multiplexer 350 receives a select signal from HF SMCKSL 178 (shown in FIG. 2). The select signal is an m bit signal, where m is as defined above. Based on the value of the select signal, multiplexer 350 selects one of its inputs In1 to InN and provides the selected input as an output. The output is provided to single-stage equalizer control logics 171 to 174 and to multi-stage equalizer control circuit 185.

In digital-to-analog converter 300, the voltage level at each of the inputs In1 to InN is independent of the value of Rd. This is because for input In1, the voltage level is ground, and for inputs In2 to InN, the voltage level depends on a ratio in which Rd is both in the numerator and the denominator of the ratio and is, therefore, cancelled. This helps digital-to-analog converter 300 to significantly reduce problems associated with uncertainties in resistor ratios/values (e.g., poly resistor ratios/values) or with variations across temperature and process from which some other digital-to-analog converters suffer. As a result, digital-to-analog converter 300 provides a more precise tuning step of the analog voltage level signals for equalization control. Thus, there is virtually no distortion in the output voltage, which almost totally depends on the supply voltage Vcc and the layout geometry of the resistors Rd, which is relatively easy to control. As such, there is improved linearity in the output voltage. In one embodiment, some of the low voltage inputs of multiplexer 310 have a voltage level at or near ground and are ignored so as to improve linearity between the digital input and the analog output of the digital-to-analog converter.

Figure 4:
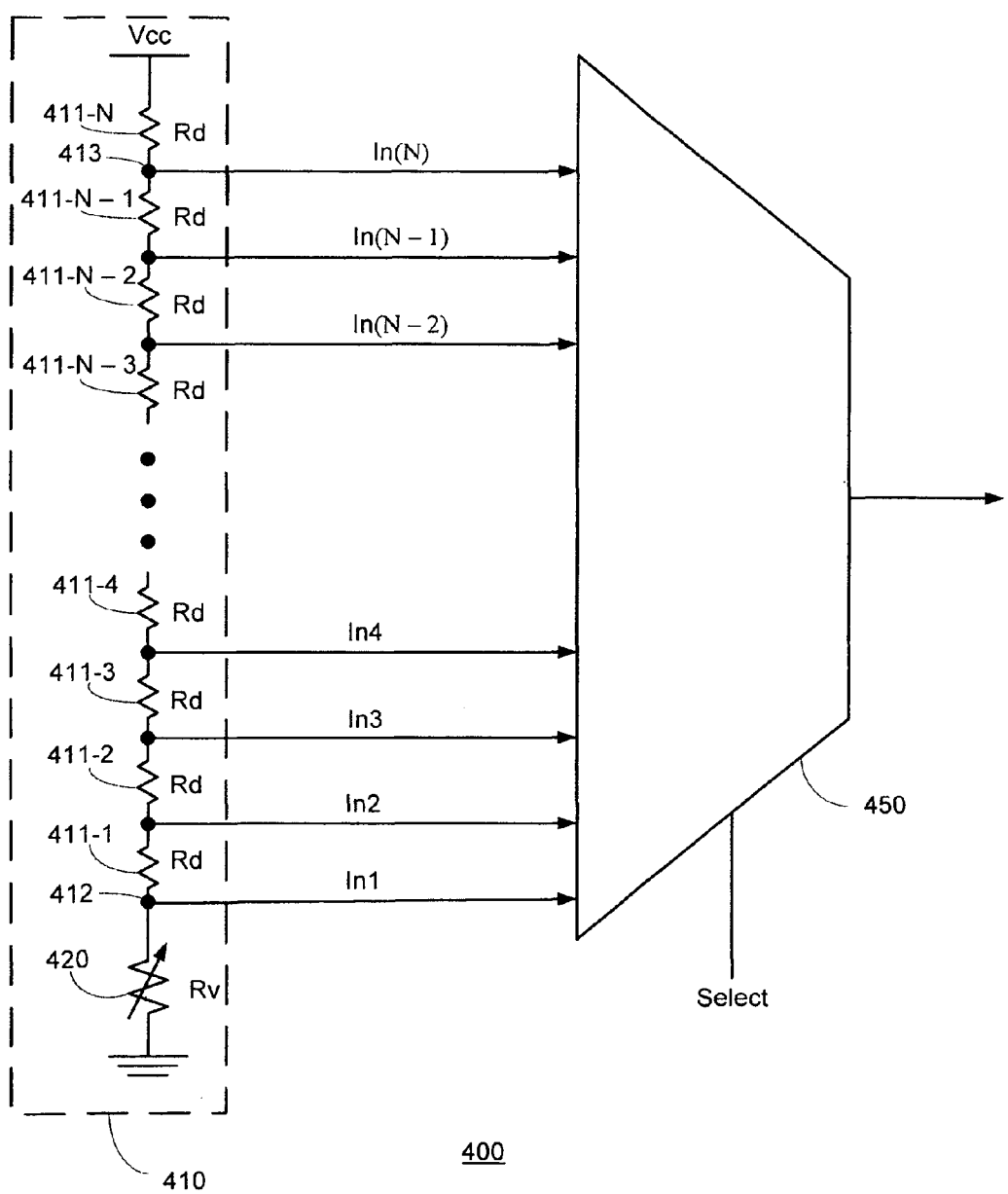
FIG. 4 is a detailed diagram of another embodiment of the digital-to-analog converter of FIG. 2.

FIG. 4 is a detailed diagram of another embodiment of the digital-to-analog converter of FIG. 2. In FIG. 4, digital-to-analog converter 400 includes voltage divider 410 and multiplexer 450 coupled as shown. Voltage divider 410 is similar to voltage divider 310 of digital-to-analog converter 300 (shown in FIG. 3). However, in addition to resistors 411-1 to 411-N, each of which has a resistance Rd, voltage divider 410 also includes programmable resistor 420 with programmable resistance Rv. Programmable resistor 420 may also herein be referred to as variable resistor 420. In one embodiment, programmable resistor 420 may be programmable in user mode (i.e., at runtime). Resistor 420 is coupled between ground and the first input of multiplexer 450. Multiplexer 450, like multiplexer 350, is an N by 1 multiplexer, where N is as defined above. The first input, input In1, is the lowest voltage input into multiplexer 450 and is coupled to node 412. The voltage at node 412 is $I_{410}$*Rv, where $I_{410}$ represents the current through voltage divider 410. In other words, the voltage at node 412 is equal to the voltage across programmable resistor 420. The last input, input InN, is the highest voltage input into multiplexer 450 and is coupled node 413. The voltage at node 413 is Vcc-$I_{410}$*Rd, where Vcc is the supply voltage applied to voltage divider 410. In one embodiment, $I_{410}$ is a low current. In other words, in one embodiment, voltage divider 410 is a low Icc voltage divider.

In addition to inputs In1 to InN from voltage divider 410, multiplexer 450 receives a select signal from HF SMCKSL 178 (shown in FIG. 2). The select signal is an m bit signal. Based on the value of the select signal, multiplexer 450 selects one of its inputs In1 to InN and provides the selected input as an output. The output is provided to single-stage equalizer control logics 171 to 174 and to multi-stage equalizer control circuit 185.

It is to be noted that with programmable resistor 420, the bottom limit voltage level of voltage divider 410 (which is the voltage at node 412) is increased. This increases the likelihood that the voltage output by multiplexer 450 to equalizer 110 (via single-stage equalizer control logic 171 to 174 and multi-stage equalizer control circuit 185) is in the range where equalizer 110 has greater sensitivity to control voltage variations. This is done by increasing the likelihood that the control voltage is above a level where equalization gain is leveled. With the higher bottom limit voltage level, tuning steps at the bottom of the voltage range of the voltage divider may be used. Such tuning steps may otherwise have been discarded in the case of a lower bottom limit voltage level. Also, with a higher bottom limit voltage level, there is a smaller overall voltage drop across resistors 411-1 to 411-N. As a result, the voltage drop across each resistor of resistors 411-1 to 411-N is lower. This provides for a higher tuning resolution to equalizer 110 as there is a smaller voltage difference between each of the inputs to multiplexer 450. This voltage difference can be further reduced by using a smaller resistance Rd for each of the resistors 411-1 to 411-N. It is to be noted that the aforementioned higher bottom limit voltage level and higher tuning resolution would be achieved even if resistor 420 were a fixed value resistor, rather than a programmable resistor. Thus, in one embodiment, resistor 420 is a fixed value, rather than a variable value, resistor.

It is to be noted that with voltage divider 410, the whole tuning range is compressed while the total number of voltage steps remains the same. This reduces the tuning step size and thus increases tuning granularity and enhances adaptation stability, which results in improved jitter performance. Similarly, avoiding the equalization control from wandering into the insensitive region of the equalizer tuning range also results in better jitter performance.

Figure 5:
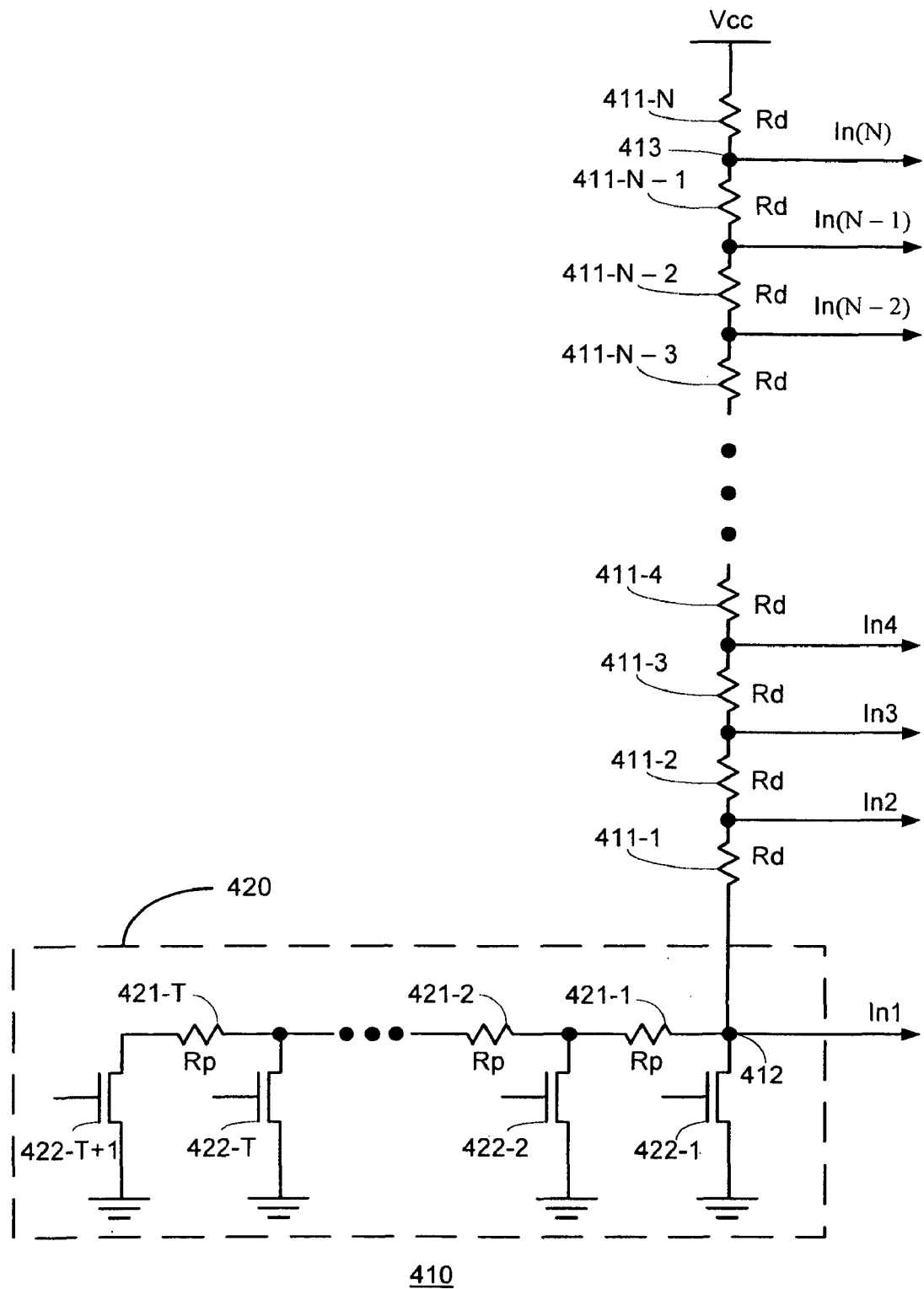
FIG. 5 is a detailed diagram of the voltage divider of FIG. 4.

FIG. 5 is a detailed diagram of the voltage divider of FIG. 4. More specifically, FIG. 5 shows variable resistor 420 of voltage divider 410 in more detail. Variable resistor 420 includes resistors 421-1 to 421-T coupled in series (where T is an integer representing the number of resistors in the series) and transistors 422-1 to 422-T+1 coupled to one or more of resistors 421-1 to 421-T and ground. In variable resistor 420, each of resistors 421-1 to 421-T has a resistance Rp. The overall resistance of variable resistor 420 is determined by which transistor of transistors 422-1 to 422-T+1 is switched on. More specifically, the first transistor of transistors 422-1 to 422-T+1 (i.e., the transistor with the lowest reference number) that is turned on determines the overall resistance of variable resistor 420. In one embodiment, at any given time, only one transistor of transistors 422-1 to 422-T+1 is on, while the remaining transistors of transistors 422-1 to 422-T+1 are off. The resistance Rv is determined by a T+1 bit control signal that controls the states of transistors 422-1 to 422-T+1. Moreover, the bottom limit voltage and the tuning resolution depend on the Rp/Rd ratio and may be digitally governed by the T+1 bit control signal.

In one embodiment, voltage divider 410 includes a power down transistor for power down mode. In one embodiment, the power down transistor may be transistors 422-1 to 422-T+1. Thus, in one embodiment, variable resistor 420 does not interfere with the power down mode of voltage divider 410. In one embodiment, during power down mode, all transistors 422-1 to 422-T+1 are on. This terminates $I_{410}$ (i.e., Icc) through voltage divider 410.

Figure 6:
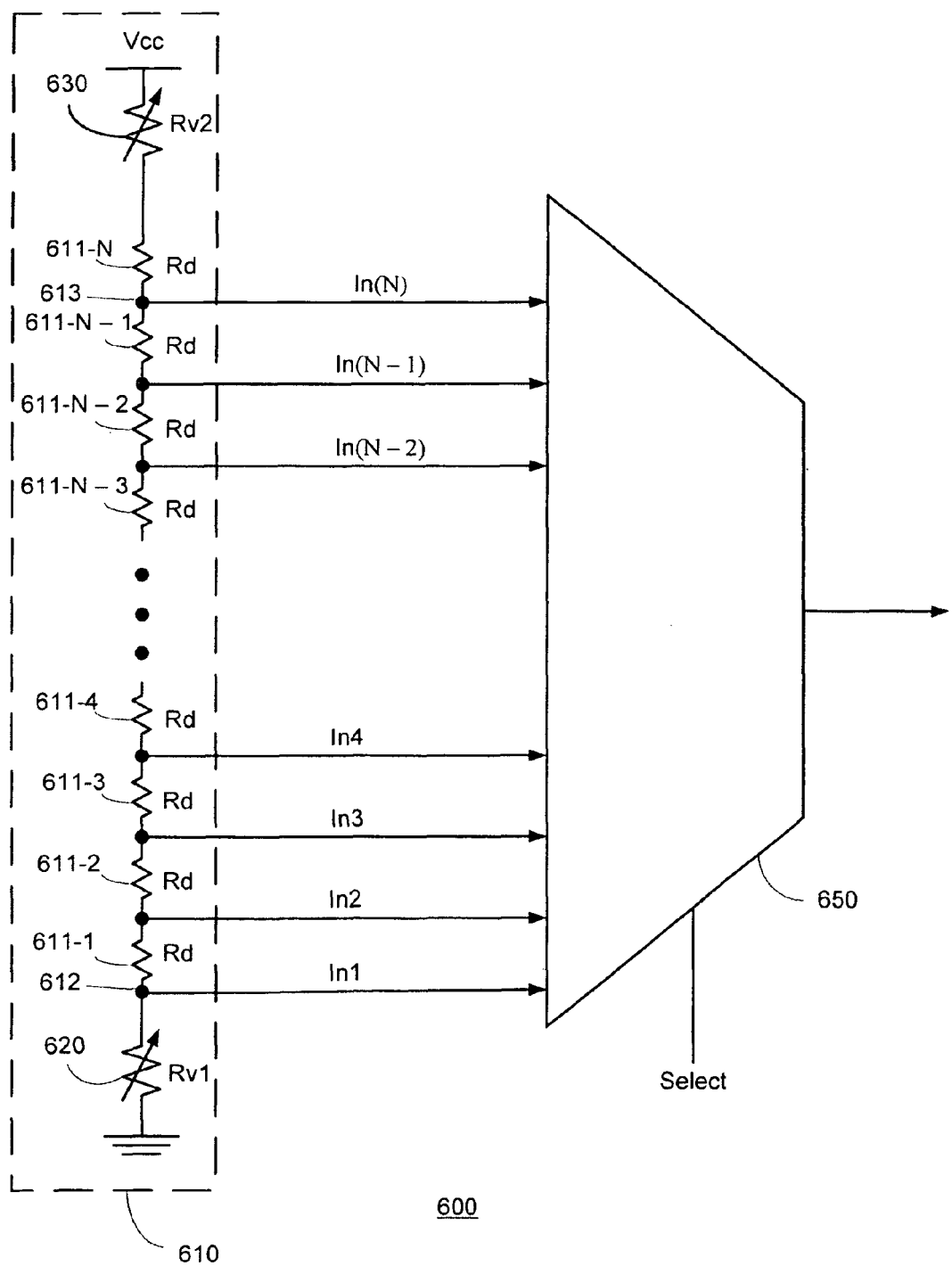
FIG. 6 is a detailed diagram of yet another embodiment of the digital-to-analog converter of FIG. 2.

FIG. 6 is a detailed diagram of yet another embodiment of the digital-to-analog converter of FIG. 2. In FIG. 6, digital-to-analog converter 600 includes voltage divider 610 and multiplexer 650 coupled as shown. Voltage divider 610 is similar to voltage divider 410 of digital-to-analog converter 400 (shown in FIG. 4). However, in addition to resistors 611-1 to 611-N, each of which has a resistance Rd, and resistor 620 with variable resistance Rv1, voltage divider 610 also includes resistor 630 with variable resistance Rv2. Resistor 620 is coupled between ground and the first input of multiplexer 650. Resistor 630 is coupled between the supply voltage Vcc and resistor 611-N. Multiplexer 650, like multiplexers 350 and 450, is an N by 1 multiplexer, where N is as defined above. The first input, input In1, is the lowest voltage input into multiplexer 650 and is coupled to node 612. The voltage at node 612 is $I_{610}$*Rv1, where $I_{610}$ represents the current through voltage divider 610. In other words, the voltage at node 612 is the voltage across resistor 620. The last input, input InN, is the highest voltage input into multiplexer 650 and is coupled node 613. The voltage at node 613 is Vcc-$I_{610}$*(Rv2+Rd), where Vcc is the supply voltage applied to voltage divider 610. In other words, the voltage at node 613 is the supply voltage minus the voltage across resistor 630 and the voltage across resistor 611-N. In one embodiment, $I_{610}$ is a low current. In other words, in one embodiment, voltage divider 610 is a low Icc voltage divider.

In addition to inputs In1 to InN from voltage divider 610, multiplexer 650 receives a select signal from HF SMCKSL logic 178 (shown in FIG. 2). The select signal is an m bit signal. Based on the value of the select signal, multiplexer 650 selects one of its inputs In1 to InN and provides the selected input as an output. The output is provided to single-stage equalizer control logics 171 to 174 and to multi-stage equalizer control circuit 185.

It is to be noted that with resistor 620, the bottom limit voltage level of voltage divider 610 (which is the voltage at node 612) is increased. Additionally, the tuning resolution of the control voltage provided by multiplexer 650 to equalizer 110 is increased. Similarly, with resistor 630, the upper limit voltage level of voltage divider 610 (which is the voltage at node 613) is decreased. This further increases the tuning resolution of the control voltage provided by multiplexer 650 to equalizer 110. Additionally, it further increases the likelihood that the voltage output by multiplexer 650 to equalizer 110 (via single-stage equalizer control logics 171 to 174 and multi-stage equalizer control circuit 185) is in the range where equalizer 110 has greater sensitivity to control voltage variations. This is done by increasing the likelihood that the control voltage is below a level where equalization gain is leveled. Thus, with resistors 620 and 630, the control voltage is more likely to be within a band where equalization gain is not leveled. In other words, the control voltage is in a band between two ranges where equalization gain is leveled. It is to be noted that the aforementioned higher bottom limit voltage level and higher tuning resolution would be achieved even if resistor 630 were a fixed value resistor rather than a programmable resistor. Thus, in one embodiment, resistor 630 is a fixed value, rather than a variable value, resistor.

It is to be noted that with voltage divider 610, the whole tuning range is compressed while the total number of voltage steps remains the same. This reduces the tuning step size and thus increases tuning granularity and enhances adaptation stability, which results in improved jitter performance. Similarly, avoiding the equalization control from wandering into the insensitive region of the equalizer tuning range also results in better jitter performance.

Figure 7:
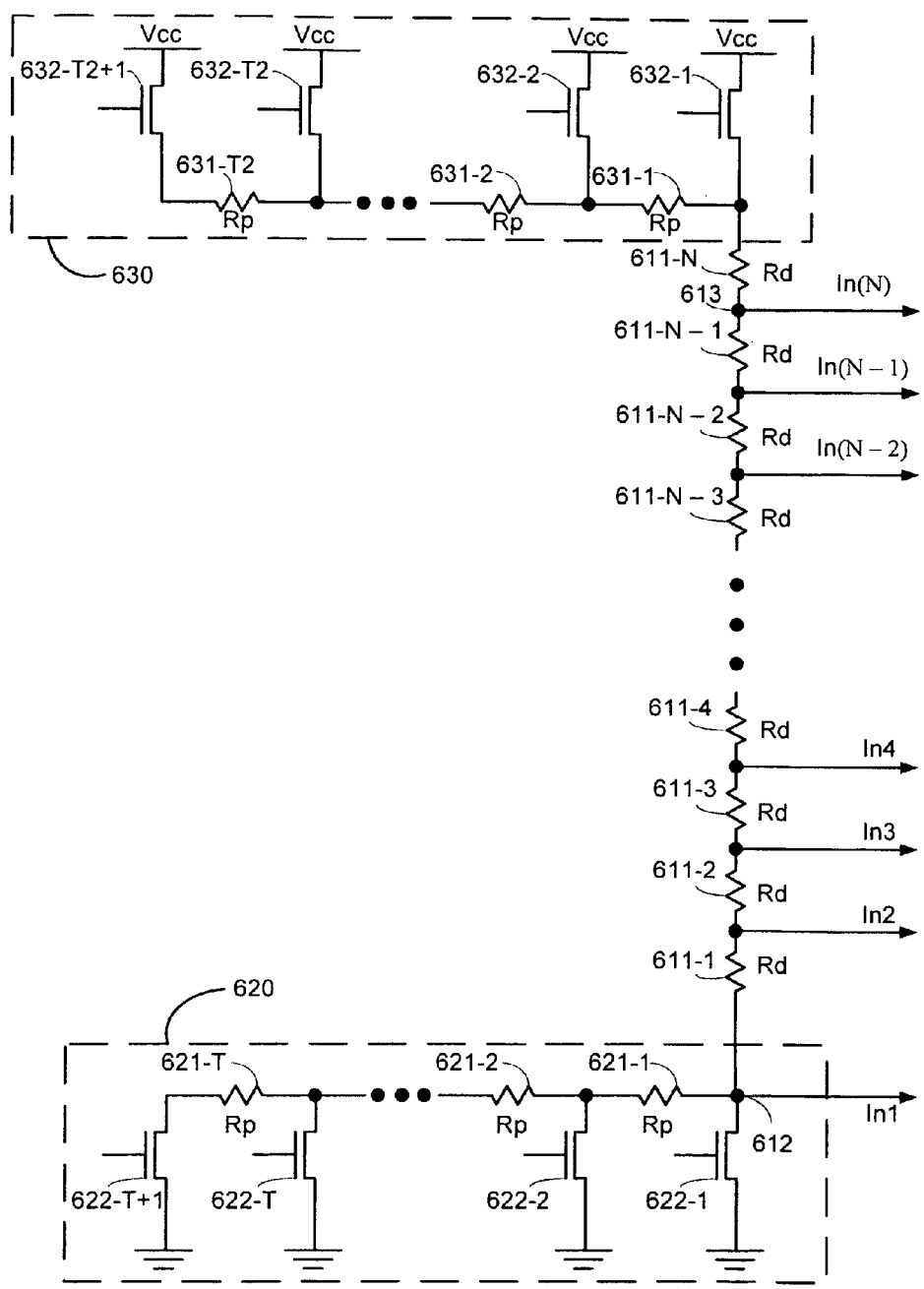
FIG. 7 is a detailed diagram of the voltage divider of FIG. 6.

FIG. 7 is a detailed diagram of the voltage divider of FIG. 6. More specifically, FIG. 7 shows variable resistors 620 and 630 of voltage divider 610 in more detail. Variable resistor 620, which includes resistors 621-1 to 621-T and transistors 622-1 to 622-T+1 coupled as shown in FIG. 7, is similar to variable resistor 420. In variable resistor 620 parts corresponding to those in variable resistor 420 are referenced by reference numbers that differ from those of their corresponding parts in variable resistor 420 by 200. As variable resistor 620 is similar to variable resistor 420 and variable resistor 420 has been described above, variable resistor 620 is not described in greater detail herein.

Variable resistor 630 includes resistors 631-1 to 631-T2 coupled in series (where T2 is an integer that represents the number of resistors in the series) and transistors 632-1 to 632-T2+1 coupled to one or more of resistors 631-1 to 631-T2 and Vcc. In one embodiment, T2 is equal to T. In variable resistor 630, each of resistors 631-1 to 631-T2 has a resistance Rp. The overall resistance of variable resistor 630 is determined by which transistor of transistors 632-1 to 632-T2+1 is switched on. More specifically, the first transistor of transistors 632-1 to 632-T2+1 (i.e., the transistor with the lowest reference number) that is turned on determines the overall resistance of variable resistor 630. In one embodiment, at any given time, only one transistor of transistors 632-1 to 632-T2+1 is on, while the remaining transistors of transistors 632-1 to 632-T2+1 are off.

In one embodiment, Rp is equal to Rd. As a result, for both digital-to-analog converters 400 and 600, the voltage level at each of the inputs In1 to InN is independent of the value of Rd and Rp. Such embodiments of digital-to-analog converters 400 and 600 provide the benefits discussed above with respect to digital-to-analog converter 300 when the voltage level at inputs In1 to InN is independent of the value of Rd. Moreover, digital-to-analog converters 400 and 600 provide even further tuning resolution and linearity than digital-to-analog converter 300. It is to be noted that, in embodiments where Rd is not equal to Rp, the voltage level at inputs In1 to InN mainly depends on the supply voltage Vcc and the ratio Rd/Rp. The Rd/Rp ratio mainly depends on the layout geometry of the Rd and Rp resistors, which is relatively easy to control.

In one embodiment, the adaptation engine of the present invention uses a low-speed adaptive clock and adaptive algorithm. More specifically, in one embodiment, the adaptation engine operates at a clock frequency of less than or equal to approximately 125 MHz, in cases where Icc of the voltage divider in the digital-to-analog converter is approximately 640 milliamperes (mA) or less. In another embodiment, the adaptation engine operates at a clock frequency of less than or equal to 300 MHz, in cases where Icc is higher than approximately 640 mA.

An equalization circuitry according to an embodiment of the present invention might be included in a variety of integrated circuits (ICs), including ICs that are programmable logic devices (PLDs). PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EE-PLDs), logic cell arrays (LCAs), field programmable gate arrays (FPGAs), or by other names) provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Configuration elements may be realized as random access memory (RAM) bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a "configuration RAM" (CRAM)). However, many types of configurable elements may be used including static or dynamic RAM (SRAM or DRAM), electrically erasable read-only memory (EEROM), flash, fuse, and anti-fuse programmable connections. The programming of configuration elements can also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

Figure 8:
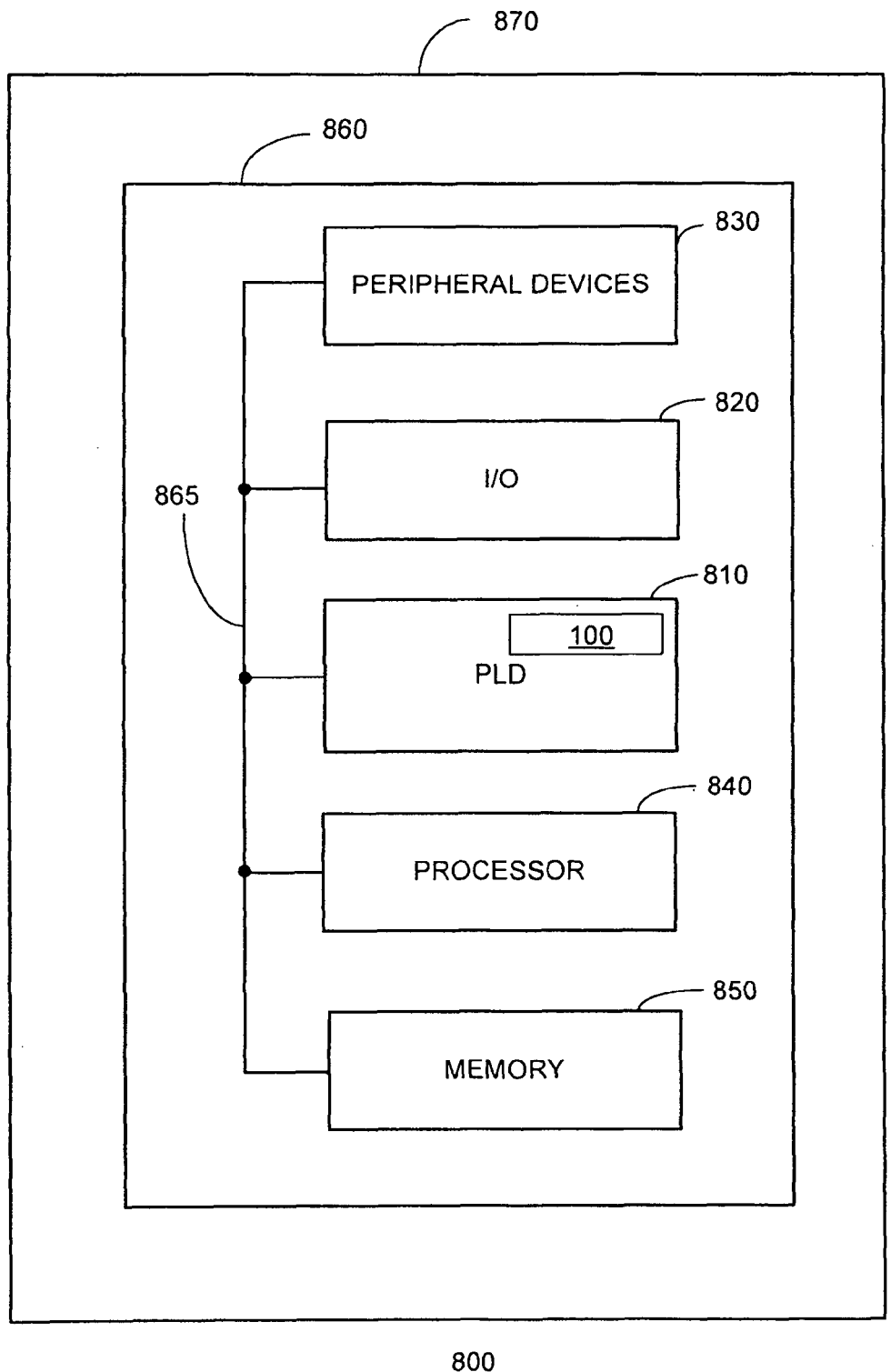
FIG. 8 illustrates an exemplary data processing system including an exemplary programmable logic device in which embodiments of the equalization circuitry in accordance with the present invention might be implemented.

FIG. 8 illustrates an exemplary data processing system including an exemplary PLD in which embodiments of the equalization circuitry in accordance with the present invention might be implemented. In FIG. 8, data processing system 800, among other things, includes PLD 810. PLD 810, in turn, includes equalization circuitry 100. In one embodiment, equalization circuitry 100 is on the same die/chip as PLD 810. In one embodiment, the logic for equalization circuitry 100 is supported by the programmable PLD core of PLD 810. Data processing system 800 may include one or more of the following components: processor 840, memory 850, input/output (I/O) circuitry 820, and peripheral devices 830. These components are coupled together by system bus 865 and are populated on circuit board 860 which is contained in end-user system 870. A data processing system such as system 800 may include a single end-user system such as end-user system 870 or may include a plurality of systems working together as a data processing system.

System 800 can be used in a wide variety of applications, such as computer networking, data networking, instrumentation, video processing, digital signal processing (DSP), or any other application where the advantage of using programmable or reprogrammable logic is desirable. PLD 810 can be used to perform a variety of different logic functions. For example, PLD 810 can be configured as a processor or controller that works in cooperation with processor 840 (or, in alternative embodiments, a PLD might itself act as the sole system processor). PLD 810 may also be used as an arbiter for arbitrating access to a shared resource in system 800. In yet another example, PLD 810 can be configured as an interface between processor 840 and one of the other components in system 800. It should be noted that system 800 is only exemplary.

In one embodiment, system 800 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An equalization circuitry comprising:
   a digital-to-analog converter including:
      a voltage divider; and
      a multiplexer coupled to the voltage divider;
   a state machine counter coupled to the digital-to-analog converter, wherein the state machine counter provides a selection signal to the multiplexer;
   a plurality of equalizer control logic circuits coupled to the digital-to-analog converter; and
   a control logic circuit selection logic to provide a selection signal for selecting an equalizer control logic circuit from the plurality of equalizer control logic circuits.

2. The equalization circuitry of claim 1, wherein the plurality of equalizer control logic circuits includes a plurality of single-stage equalizer control logic circuits and wherein the digital-to-analog converter provides a control signal to the plurality of single-stage equalizer control logic circuits.

3. The equalization circuitry of claim 1, wherein the multiplexer receives a plurality of inputs from the voltage divider and selects an output from the plurality of inputs.

4. The equalization circuitry of claim 1, wherein the voltage divider includes a plurality of resistors coupled in series.

5. The equalization circuitry of claim 4, wherein the voltage divider further includes a first resistor coupled to the plurality of resistors, ground, and a lowest voltage input terminal of the multiplexer, further wherein a voltage across the first resistor is an input voltage to the lowest voltage input terminal.

6. The equalization circuitry of claim 5, wherein the first resistor includes a second plurality of resistors coupled in series and a plurality of transistors, wherein each transistor of the plurality of transistors is coupled to ground and a corresponding resistor of the second plurality of resistors.

7. The equalization circuitry of claim 5, wherein the voltage divider further includes a second resistor coupled to the plurality of resistors and a supply voltage, further wherein the supply voltage minus a voltage across the second resistor is an a voltage across a resistor of the plurality of resistors is an input voltage to a highest voltage input terminal of the multiplexer.

8. The equalization circuitry of claim 7, wherein the first and second resistors are programmable in user mode.

9. The equalization circuitry of claim 1 further comprising:
   an equalizer including a plurality of equalization stages;
   wherein the plurality of equalizer control logic circuits includes:
      a multi-stage equalizer control logic circuit coupled to the equalizer; and
      a plurality of single-stage equalizer control logic circuits coupled to the digital-to-analog converter and the equalizer, wherein each single-stage equalizer control logic circuit of the plurality of single-stage equalizer control logic circuits is coupled to a corresponding equalization stage of the plurality of equalization stages.

10. The equalization circuitry of claim 9, wherein
   the control logic circuit selection logic is coupled to the digital-to-analog converter, the multi-stage equalizer control logic circuit, and the plurality of single-stage equalizer control logic circuits, wherein the state machine counter is coupled to the multi-stage equalizer control logic circuit and the plurality of single-stage equalizer control logic circuits and the control logic circuit selection logic provides the selection signal for selecting an equalizer control logic circuit from the multi-stage equalizer control logic circuit and the plurality of single-stage equalizer control logic circuits.

11. The equalization circuitry of claim 10 further comprising:
   a reference edge generator coupled to the equalizer;
   a first high pass filter coupled to the equalizer and an input terminal of the reference edge generator;
   a second high pass filter coupled to an output terminal of the reference edge generator;
   a first rectifier coupled to an output terminal of the first high pass filter;
   a second rectifier coupled to an output terminal of the second high pass filter; and
   a comparator coupled to an output terminal of the first rectifier, an output terminal of the second rectifier, and an up/down input terminal of the state machine counter.

12. A programmable logic device including the equalization circuitry of claim 1.

13. A digital system comprising a programmable logic device including the equalization circuitry of claim 1.

14. A method of equalization, the method comprising:
   voltage dividing a voltage signal into a plurality of voltage signals;
   selecting one voltage signal from the plurality of voltage signals;
   controlling an equalizer with the one voltage signal;
   using a state machine counter to provide a selection signal for the selecting the one voltage signal; and
   using a control logic circuit selection logic to provide a selection signal for selecting an equalizer control logic circuit from a plurality of equalizer control logic circuits.

15. The method of claim 14, wherein the voltage dividing includes applying the voltage signal to a plurality of resistors coupled in series.

16. The method of claim 14, wherein the voltage dividing includes applying the voltage signal to a plurality of resistors coupled in series, wherein the plurality of resistors includes a first plurality of resistors coupled in series and a programmable resistor coupled to ground and the first plurality of resistors, further wherein a lowest voltage of the plurality of voltage signals is a non-zero voltage signal.

17. The method of claim 14, wherein the voltage dividing includes applying the voltage signal to a plurality of resistors coupled in series, wherein the plurality of resistors includes a first plurality of resistors coupled in series, a first programmable resistor coupled to ground and the first plurality of resistors, and a second programmable resistor coupled to the voltage signal and the first plurality of resistors, further wherein a lowest voltage of the plurality of voltage signals is a non-zero voltage signal and a highest voltage of the plurality of voltage signals is the voltage signal minus a voltage across a resistor of the first plurality of resistors and a voltage across the second programmable resistor.

18. The method of claim 14 further comprising:
providing an equalizer output to a reference edge generator;
first high pass filtering the equalizer output;
second high pass filtering an output of the reference edge generator;
first rectifying an output of the first high pass filtering;
second rectifying an output terminal of the second high pass filtering;
comparing an output of the first rectifying and an output of the second rectifying; and
providing an output of the comparing to increment or decrement a count of the state machine counter.

19. The method of claim 14, wherein the plurality of equalizer control logic circuits comprise a multi-stage equalizer control logic circuit and a plurality of single-stage equalizer control logic circuits, wherein each single-stage equalizer control logic circuit of the plurality of single-stage equalizer control logic circuits is coupled to a corresponding equalization stage of a plurality of equalization stages of the equalizer.

20. An equalization circuitry comprising:
(a) a digital-to-analog converter including:
   (i) a voltage divider including a first plurality of resistors coupled in series and a first programmable resistor coupled to the first plurality of resistors and ground; and
   (ii) a multiplexer coupled to the voltage divider, wherein the multiplexer receives a plurality of inputs from the voltage divider and selects an output from the plurality of inputs, further wherein the first programmable resistor is coupled to a lowest voltage input terminal of the multiplexer, and a voltage across the first programmable resistor is an input voltage to the lowest voltage input terminal;
(b) an equalizer including a plurality of equalization stages;
(c) a multi-stage equalizer control logic circuit coupled to the digital-to-analog converter and the equalizer, wherein the multi-stage equalizer control logic circuit is coupled to the plurality of equalization stages;
(d) a plurality of single-stage equalizer control logic circuits coupled to the digital-to-analog converter and the equalizer, wherein the digital-to-analog converter provides a control signal to the multi-stage equalizer control logic circuit and the plurality of single-stage equalizer control logic circuits, further wherein each single-stage equalizer control logic circuit of the plurality of single-stage equalizer control logic circuits is coupled to a corresponding equalization stage of the plurality of equalization stages; and
(e) a state machine counter and a control logic circuit selection logic coupled to the digital-to-analog converter, the multi-stage equalizer control logic circuit, and the plurality of single-stage equalizer control logic circuits, wherein the state machine counter provides a selection signal to the multiplexer and the control logic circuit selection logic provides a selection signal for selecting an equalizer control logic circuit from the multi-stage equalizer control logic circuit and the plurality of single-stage equalizer control logic circuits.

21. The equalization circuitry of claim 20, wherein the first programmable resistor includes a second plurality of resistors coupled in series and a plurality of transistors, wherein each transistor of the plurality of transistors is coupled to ground and a corresponding resistors of the second plurality of resistors, further wherein the voltage divider further includes a second programmable resistor coupled to the first plurality of resistors and a supply voltage, further wherein the supply voltage minus a voltage across the second programmable resistor and a voltage across a resistor of the first plurality of resistors is an input voltage to a highest voltage input terminal of the multiplexer.

22. The equalization circuitry of claim 20 further comprising:
a reference edge generator coupled to the equalizer;
a first high pass filter coupled to the equalizer and an input terminal of the reference edge generator;
a second high pass filter coupled to an output terminal of the reference edge generator;
a first rectifier coupled to an output terminal of the first high pass filter;
a second rectifier coupled to an output terminal of the second high pass filter; and
a comparator coupled to an output terminal of the first rectifier, an output terminal of the second rectifier, and an up/down input terminal of the state machine counter.

23. A programmable logic device including the equalization circuitry of claim 20.

24. A digital system comprising a programmable logic device including the equalization circuitry of claim 20.

* * * * *